United States Patent
Horng et al.

(10) Patent No.: US 8,109,713 B2
(45) Date of Patent: Feb. 7, 2012

(54) HEAT-DISSIPATING FAN

(75) Inventors: Alex Horng, Kaohsiung (TW); Tso-Kuo Yin, Kaohsiung (TW); Shen-Kung Tseng, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 438 days.

(21) Appl. No.: 12/410,112

(22) Filed: Mar. 24, 2009

(65) Prior Publication Data

US 2010/0243218 A1    Sep. 30, 2010

(51) Int. Cl.
*F04D 31/00* (2006.01)
(52) U.S. Cl. .................. 415/116; 415/114; 165/121
(58) Field of Classification Search ............. 415/114, 415/115, 116, 125; 165/121
See application file for complete search history.

(56) References Cited

U.S. PATENT DOCUMENTS

| 4,164,690 | A | 8/1979 | Muller et al. | |
| 6,318,976 | B1 | 11/2001 | Hsieh | |
| 7,332,842 | B2 * | 2/2008 | Kasahara et al. | 310/84 |
| 7,800,263 | B2 * | 9/2010 | Horng et al. | 310/67 R |

FOREIGN PATENT DOCUMENTS

TW      M309021      4/2007

* cited by examiner

*Primary Examiner* — David Nhu
(74) *Attorney, Agent, or Firm* — Alan Kamrath; Kamrath IP Lawfirm, PA

(57) ABSTRACT

A heat-dissipating fan includes a housing, a stator, a rotor and at least one retaining member. The stator and rotor are received inside the housing. The rotor includes an impeller having a plurality of blades. The at least one retaining member is removably mounted to the housing and includes a retaining plate. In an axial direction of the rotor, the retaining plate extends to be above and within a rotational area of the blades to retain the rotor to avoid departure of the rotor from the housing, even if the heat-dissipating fan is hit hard while it is packed, moved, transported or operating. Besides, the arrangement of the retaining member won't result in reduction of air input. Consequently, the retaining member can be quickly mounted to the housing at a predetermined position to enhance convenience of assembly.

14 Claims, 11 Drawing Sheets

HEAT-DISSIPATING FAN

BACKGROUND OF THE INVENTION

1. Field of the Invention

The present invention relates to a heat-dissipating fan and, more particularly, to a small axial-flow fan that can prevent a rotor thereof from disengaging.

2. Description of the Related Art

The current trend of research and development in electronic products is miniaturization, and that leads to necessity of miniaturization of an axial-flow fan. For example, manufacturers replace a conventional retaining ring, which is disposed in a shaft tube to retain a shaft of a rotor, with a balancing plate that is made of magnetically conductive material and attracted by a permanent magnet fixed to the rotor, and then prevention of disengagement of the rotor is still achieved. Under stable operation, an axial thickness and an overall volume of a conventional heat-dissipating fan are reduced effectively to provide miniaturization of the conventional heat-dissipating fan, and thus the conventional heat-dissipating fan can be applied to a miniature electronic device or electronic apparatus.

FIG. 1 shows the above-mentioned conventional heat-dissipating fan 8, which has a balancing plate for displacing a retaining ring. The conventional heat-dissipating fan 8 includes a casing 81, a stator 82, a rotor 83 and the balancing plate 84. The casing 81 has a shaft tube 811 around which the stator 82 is mounted, and the rotor 83 has a shaft 831 rotatably inserted in the shaft tube 811 of the casing 81. The balancing plate 84 is mounted inside the casing 81 and attracted by a permanent magnet 832 that is fixed to the rotor 83, with a magnetically attracting spacing being formed between the balancing plate 84 and the permanent magnet 832. Thus, the rotor 83 disengaging from the casing 81 is avoided.

However, if the conventional heat-dissipating fan 8 is hit too hard while it is packed, moved, transported or operating, the rotor 83 will easily depart from the casing 81, because prevention of departure of the rotor 83 from the casing 81 is provided merely by the magnetic attraction between the balancing plate 84 and the permanent magnet 832.

Another conventional heat-dissipating fan is described in Taiwan Patent Issue No. M309021 entitled "MINIATURE FAN" and shown in FIG. 2. Referring to FIG. 2, the conventional heat-dissipating fan 9 includes an impeller 91, a frame 92 and a base 93. The impeller 91 has a shaft 911, and there is a permanent magnet 912 arranged around the impeller 91. The frame 92 has an inlet 921 and a guiding flange 922 formed on the periphery of the inlet 921 and extending towards the center of the inlet 921. The base 93 is coupled to the frame 92 and has a shaft tube 931 receiving the shaft 911 of the impeller 91. There is a magnetically positioning ring 932 mounted on the base 93 and facing the permanent magnet 912, so that the impeller 91 is prevented from disengaging from the frame 92 by magnetic attraction formed between the magnetically positioning ring 932 and the permanent magnet 912. Besides, by the configuration of the guiding flange 922, the impeller 91 is further retained inside the frame 92.

Nevertheless, the guiding flange 922 is in the form of a ring and formed on the periphery of the inlet 921 of the frame 92 and leads the conventional heat-dissipating fan 9 to have reduced air input and lowered heat-dissipating efficiency owing to a small diameter of the inlet 921. Also, the shaft tube 931, the magnetically positioning ring 932, the impeller 91 and other related components must be previously mounted to the base 93 before the frame 92 and the base 93 are assembled due to the arrangement of the guiding flange 922. Hence, the frame 92 and the base 93 can not be integrally formed to be a fan housing that is of merely one piece, so that inconvenience of assembling is provided.

SUMMARY OF THE INVENTION

It is therefore the primary objective of this invention to provide a heat-dissipating fan whose rotor is prevented from disengaging.

The second objective of the present invention is to provide a heat-dissipating fan that provides reliable heat-dissipating efficiency.

The third objective of the present invention is to provide a heat-dissipating fan with an assembly thereof being unlimited.

A heat-dissipating fan according to the preferred teachings of the present invention includes a housing, a stator, a rotor and a retaining member. The housing includes an air inlet and an air outlet. The stator is received inside the housing. The rotor includes a shaft and an impeller fixed to one end of the shaft. The impeller faces the stator and has a plurality of blades. One radially outer free end of each blade has a first corner close to the air inlet and a second corner close to the air outlet. There is a first peripheral spacing defined as a projection of a first distance on a plane perpendicular to the shaft, and the first distance is between adjacent first and second corners, which are respectively on any two adjacent blades. The retaining member includes a retaining plate and is removably mounted to the housing at a portion that delimits the air inlet. In an axial direction of the shaft, the retaining plate extends to be above the air inlet and within a rotational area of the blades. One end of the retaining plate, which extends to be above the air inlet, has a first edge corner and a second edge corner. There is a second peripheral spacing between the first and second edge corners and larger than the first peripheral spacing. Accordingly, the rotor is prevented from disengaging from the housing, and a reliably heat-dissipating efficiency is provided.

Another heat-dissipating fan according to the preferred teachings of the present invention includes a housing, a stator, a rotor and a plurality of retaining members. The housing includes an air inlet and an air outlet. The stator is received inside the housing. The rotor includes a shaft and an impeller fixed to one end of the shaft. The impeller faces the stator and has a plurality of blades. The retaining members are removably mounted to the housing at a portion that delimits the air inlet. In an axial direction of the shaft, each retaining member includes a retaining plate extending to be above the air inlet and within a rotational area of the blades. At least one retaining member axially covers a part of one of the blades of the rotor with its retaining plate. Accordingly, the rotor is prevented from disengaging from the housing, and a reliably heat-dissipating efficiency is provided.

In a most preferred form, the portion delimiting the air inlet forms an assembling section, and the retaining member is removably mounted to the assembling section. Accordingly, the retaining member can be mounted to the housing at a predetermined position to enhance convenience of assembly.

In a most preferred form, the assembling section is a recess, and the retaining member further includes a body and a combining block formed on a bottom of the body. The combining block is received in the recess, with the retaining plate being formed on a side of the body. Accordingly, the retaining member can be quickly wedged in the recess-shaped assembling section.

In a most preferred form, plural through holes are formed in the recess-shaped assembling section, and plural positioning protrusions are formed on the bottom of the body, with the positioning protrusions being inserted into the through holes. Accordingly, the retaining member and the assembling section are combined reliably.

In a most preferred form, a power line is electrically connected to the stator and one end of the power line extends out of the housing through the recess-shaped assembling section, with the power line being sandwiched between the retaining member and the assembling section. Accordingly, the power line is positioned reliably.

In a most preferred form, there is a third peripheral spacing defined as a projection of a second distance on the plane perpendicular to the shaft, with the second distance being between two first corners of any two adjacent blades. The second peripheral spacing between the first and second edge corners of the retaining member being is larger than the third peripheral spacing. Accordingly, the first corner of each blade is effectively prevented from being over the top of the retaining member to avoid departure of the rotor from the housing.

In a most preferred form, the heat-dissipating fan further comprises a balancing plate made of magnetically conductive material and mounted inside the housing, with a permanent magnet being mounted to an inner periphery of the impeller to magnetically attract the balancing plate. Accordingly, the rotor is further prevented from disengaging from the housing, and the rotor is able to rotate stably.

In a most preferred form, a part of a bottom of the recess-shaped assembling section forms a step. A surface of the combining block of the retaining member is in a shape fitting the shape of the bottom of the assembling section having the step, with the surface of the combining block facing the bottom of the assembling section. Accordingly, the power line sandwiched between the combining block and the bottom of the assembling section is bent to be further positioned to avoid movement of the power line while it is pulled.

Further scope of the applicability of the present invention will become apparent from the detailed description given hereinafter. However, it should be understood that the detailed description and specific examples, while indicating preferable embodiments of the invention, are given by way of illustration only, since various modifications will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

Figure 1:
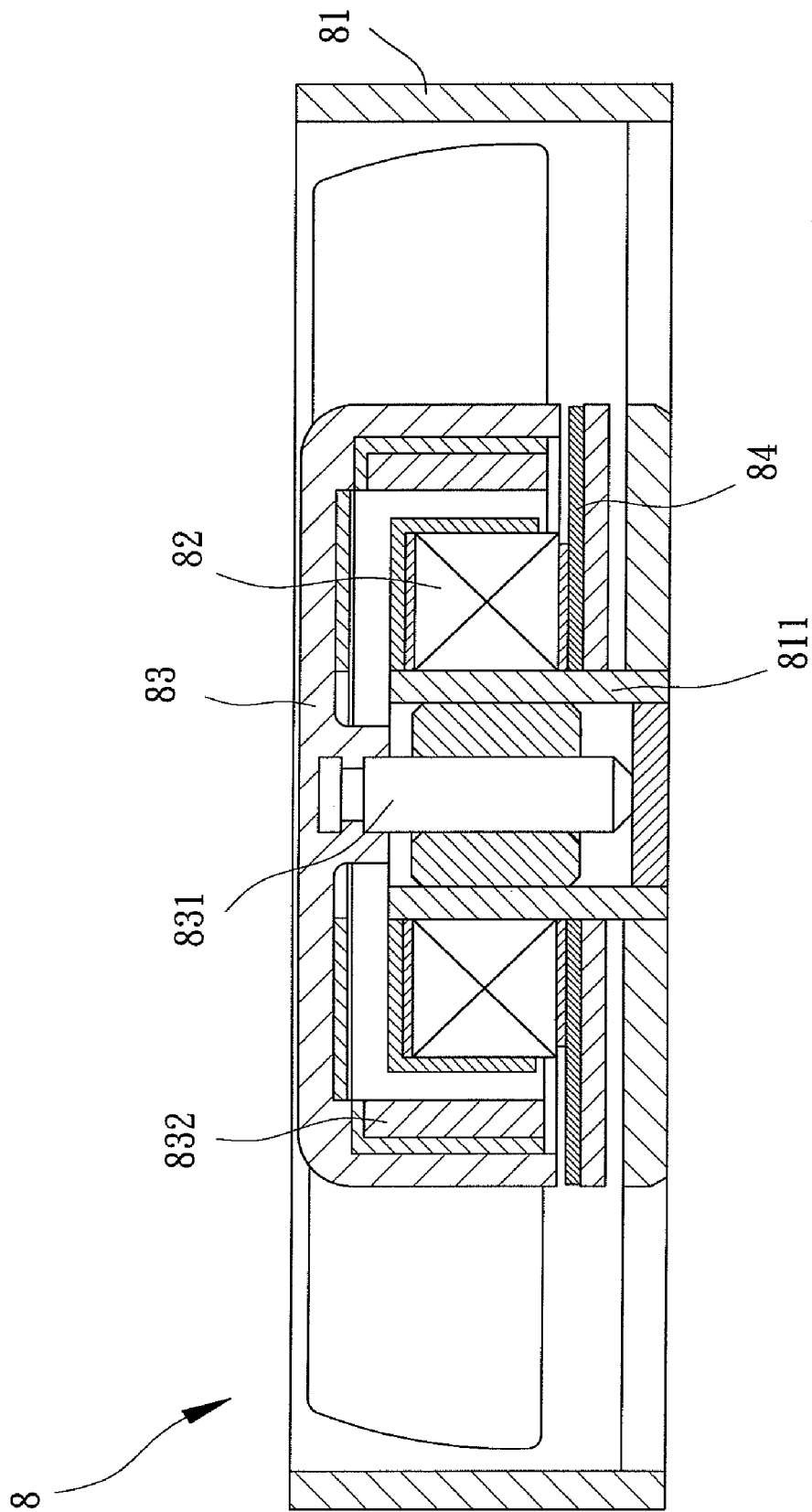
FIG. 1 is a cross sectional view illustrating a conventional heat-dissipating fan.
Figure 2:
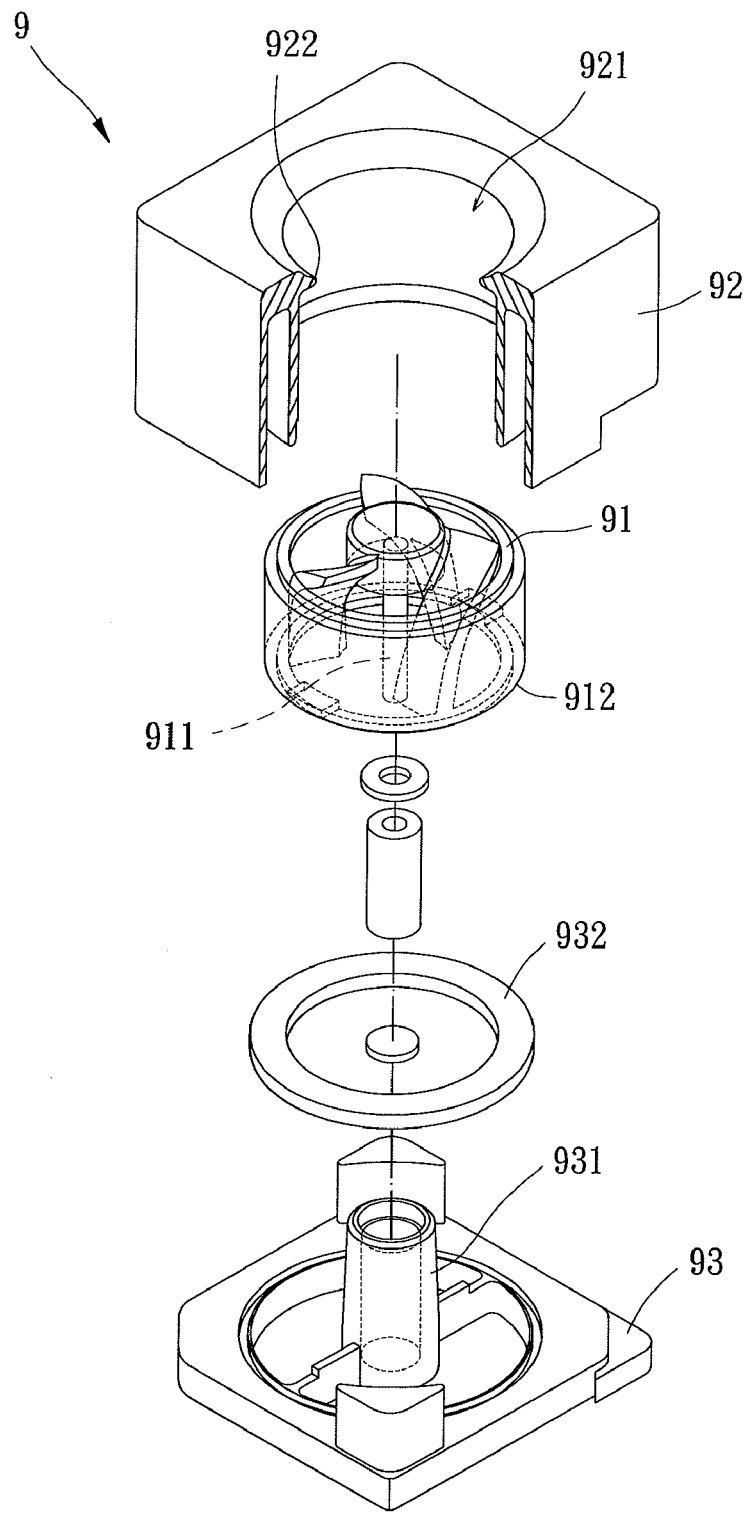
FIG. 2 is an exploded perspective view illustrating another conventional heat-dissipating fan.

All figures are drawn for ease of explanation of the basic teachings of the present invention only; the extensions of the figures with respect to number, position, relationship, and dimensions of the parts to form the preferred embodiments will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

Where used in the various figures of the drawings, the same numerals designate the same or similar parts. Furthermore, when the terms "first", "second", "inner", "end", "portion", "section", "top", "bottom", "axial", "radial", "spacing", and similar terms are used herein, it should be understood that these terms have reference only to the structure shown in the drawings as it would appear to a person viewing the drawings and are utilized only to facilitate describing the invention.

DETAILED DESCRIPTION OF THE INVENTION

Figure 3:
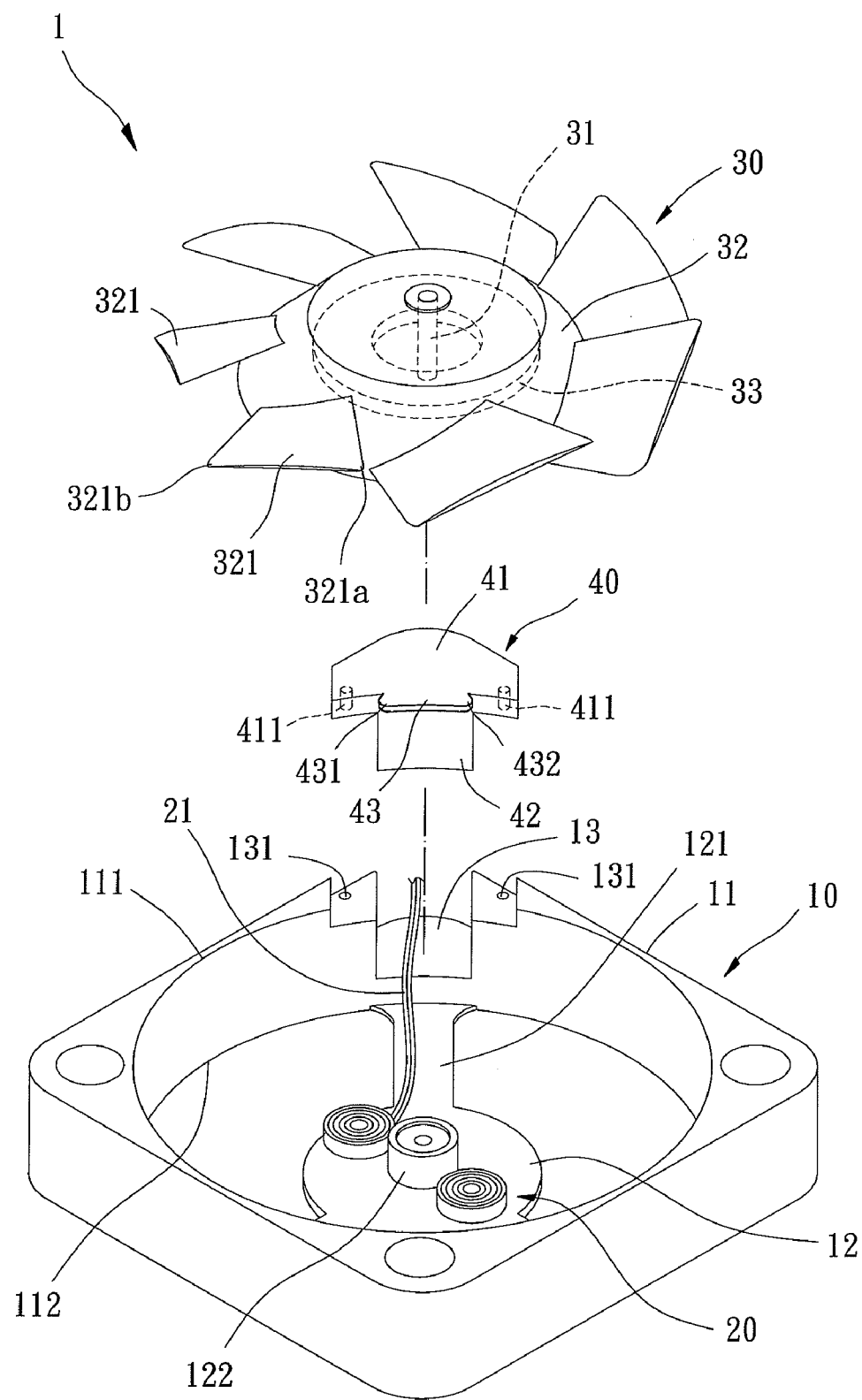
FIG. 3 is an exploded perspective view illustrating a heat-dissipating fan in accordance with a first embodiment of the present invention.
Figure 4:
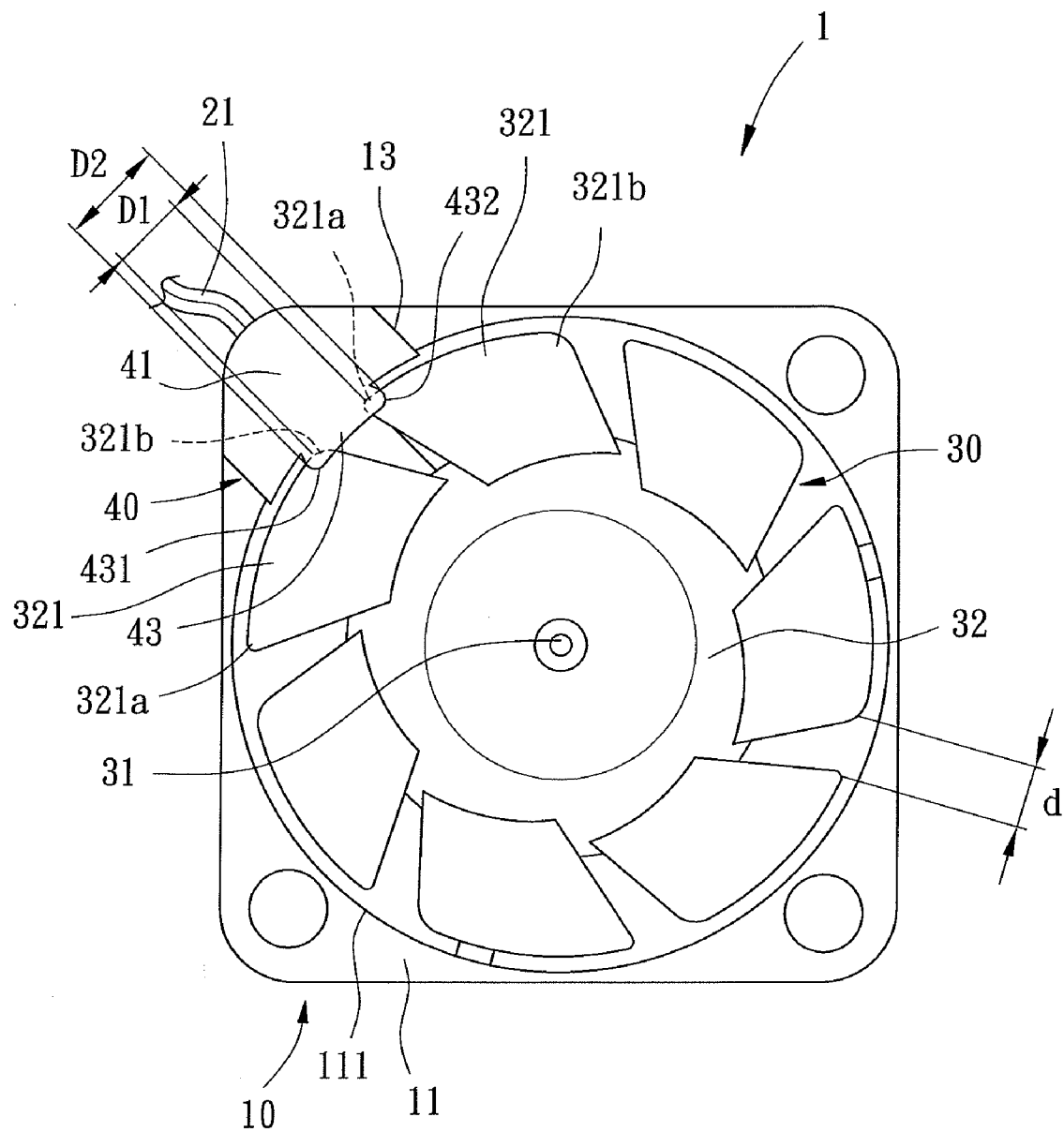
FIG. 4 is a top view illustrating the heat-dissipating fan of FIG. 3.

A heat-dissipating fan designated "1" of a first embodiment according to the preferred teachings of the present invention is shown in FIGS. 3 and 4 of the drawings. According to the first embodiment form shown, the heat-dissipating fan 1 includes a housing 10, a stator 20, a rotor 30 and a retaining member 40.

The housing 10 includes a frame body 11 and a carrying base 12. The frame body 11 has an air inlet 111 and an air outlet 112. A portion of the frame body 11 delimiting the air inlet 111 forms an assembling section 13 that can be constructed by at least one of different structures, such as recesses, holes and/or protrusions, for the retaining member 40 to be removably mounted to. In this embodiment, the assembling section 13 is a recess as shown in FIG. 3, with plural through holes 131 in the assembling section 13. The carrying base 12 is linked to a periphery of the air outlet 112 of the frame body 11 by a plurality of connecting ribs 121, and has a shaft tube 122 at the center thereof.

The stator 20 is mounted on the carrying base 12 of the housing 10 and around the shaft tube 122, with one end of a power line 21 being electrically connected to the stator 20. The other end of the power line 21 extends out of the housing 10 through the recess, namely, the assembling section 13.

The rotor 30 includes a shaft 31, an impeller 32 and a permanent magnet 33. One end of the shaft 31 is fixed to the impeller 32, and the other end thereof is rotatably received in the shaft tube 122 of the housing 10, so that the rotor 30 can be received inside the housing 10 with the impeller 32 facing the stator 20. The impeller 32 has a plurality of blades 321, with one radially outer free end of each blade 321 having two corners. The two corners are respectively a first corner 321a close to the air inlet 111 and a second corner 321b close to the air outlet 112, as shown in FIG. 4. Furthermore, there is a gap "d" defined between adjacent first and second corners 321a, 321b of any two adjacent blades 321, with the gap "d" having a first distance. A first peripheral spacing "D1" is defined as a projection of the first distance of the gap "d" on a plane perpendicular to the shaft 31. The permanent magnet 33 is mounted to an inner periphery of the impeller 32 and faces the stator 20.

The retaining member 40 is removably mounted to the assembling section 13 of the frame body 11. With this arrangement, for engagement of the retaining member 40 and the assembling section 13, the shape of the retaining member 40 is designed based on the configuration of the assembling section 13. Referring to FIG. 3, when the assembling section 13 is in the form of a recess, the retaining member 40 includes a body 41 and a combining block 42. Plural positioning protrusions 411 and the combining block 42 are formed on a bottom of the body 41, with the combining block 42 being between the positioning protrusions 411. By this configuration of the retaining member 40, the combining block 42 can be received in the recess-shaped assembling section 13, and the positioning protrusions 411 are inserted into the through holes 131, such that a reliable engagement between the retaining member 40 and the assembling section 13 is provided. Thus, the retaining member 40 can be mounted to the portion of the frame body 11 defining the air inlet 111, to be at a position of a periphery of the air inlet 111.

Moreover, the retaining member 40 further includes a retaining plate 43 formed on a side of the body 41 and extending towards the impeller 32 and, thus, in an axial direction of the shaft 31. The retaining plate 43 is above the air inlet 111 and within a rotational area of the blades 321 of the rotor 30. One end of the retaining plate 43, which does not attach to the body 41, has a first edge corner 431 and a second edge corner 432, as shown in FIG. 4. There is a second peripheral spacing "D2" between the first and second edge corners 431 and 432 and larger than the first peripheral spacing "D1". Hence, the rotor 30 can be retained in the housing 10 by the retaining member 40.

In assembly, the retaining member 40 is easily arranged beside the air inlet 111 of the housing 10 to finish the assembly of the heat-dissipating fan 1 after the stator 20 and the rotor 30 are mounted inside the housing 10. Thus, convenience of assembly is provided. Furthermore, while the retaining member 40 engages with the assembling section 13, the power line 21 connecting to the stator 20 can be sandwiched between the retaining member 40 and the assembling section 13, so as to be reliably positioned. Most importantly, even if the heat-dissipating fan 1 of the present invention is hit strongly during its packing, movement or loading, the rotor 30 is still retained by the retaining member 40 to not disengage from the housing 10, because the retaining plate 43 of the retaining member 40 extends over the rotational area of the blades 321 of the rotor 30 while the second spacing "D2" is larger than the first spacing "D1". Besides, during rotation of the rotor 30 driven by the stator 20, the retaining plate 43 also retains the turning rotor 30 effectively without a separation of the rotor 30 from the housing 10. Therefore, smooth operation of the heat-dissipating fan is provided.

Optionally, a balancing plate (not illustrated) made of magnetically conductive material can be disposed on the carrying base 12 to generate magnetic attraction between the balancing plate and the permanent magnet 33. With the retaining member 40 and the balancing plate, the rotor 30 is further prevented from departing from the housing 10 effectively and can rotate stably.

Figure 5:
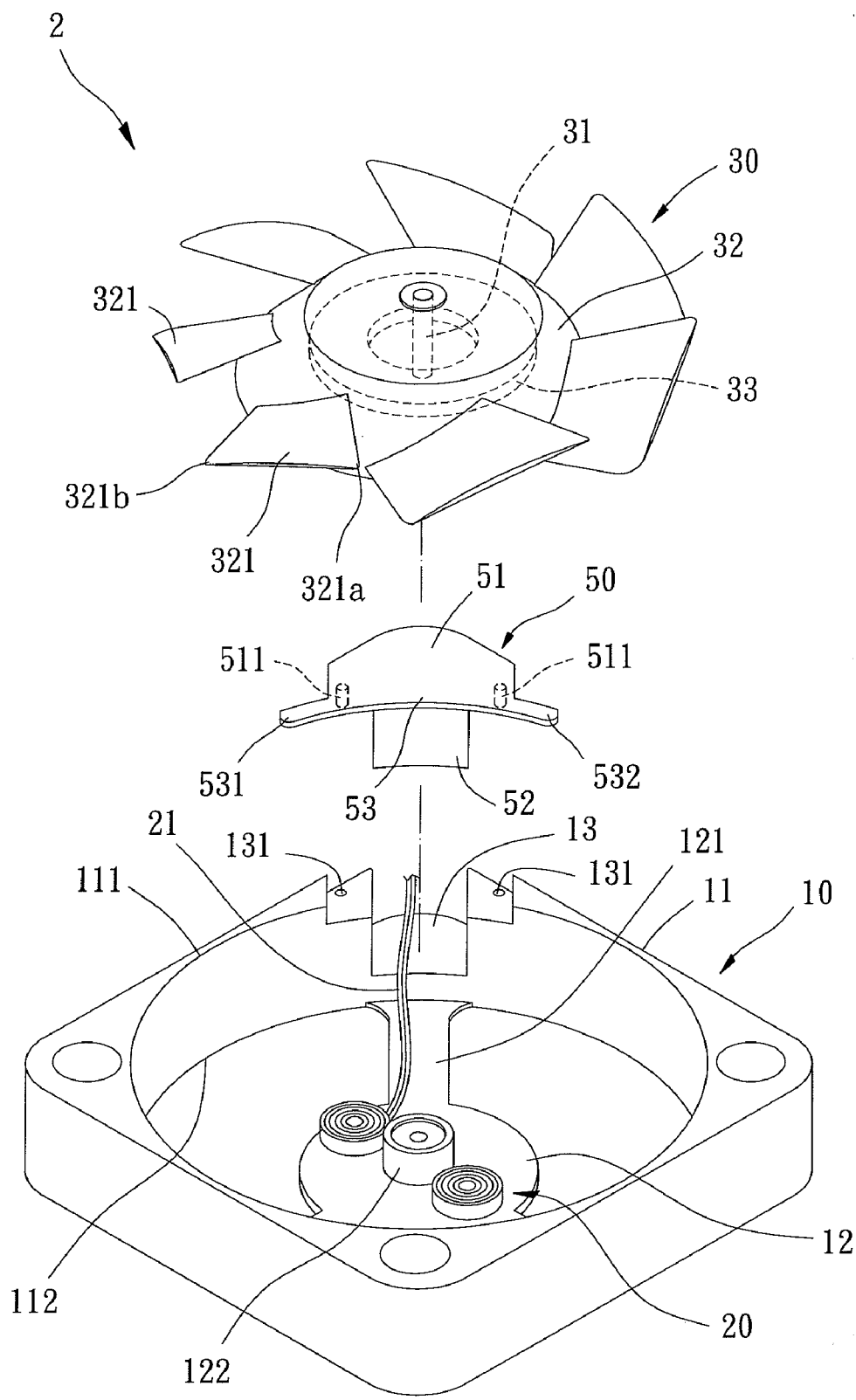
FIG. 5 is an exploded perspective view illustrating a heat-dissipating fan in accordance with a second embodiment of the present invention.
Figure 6:
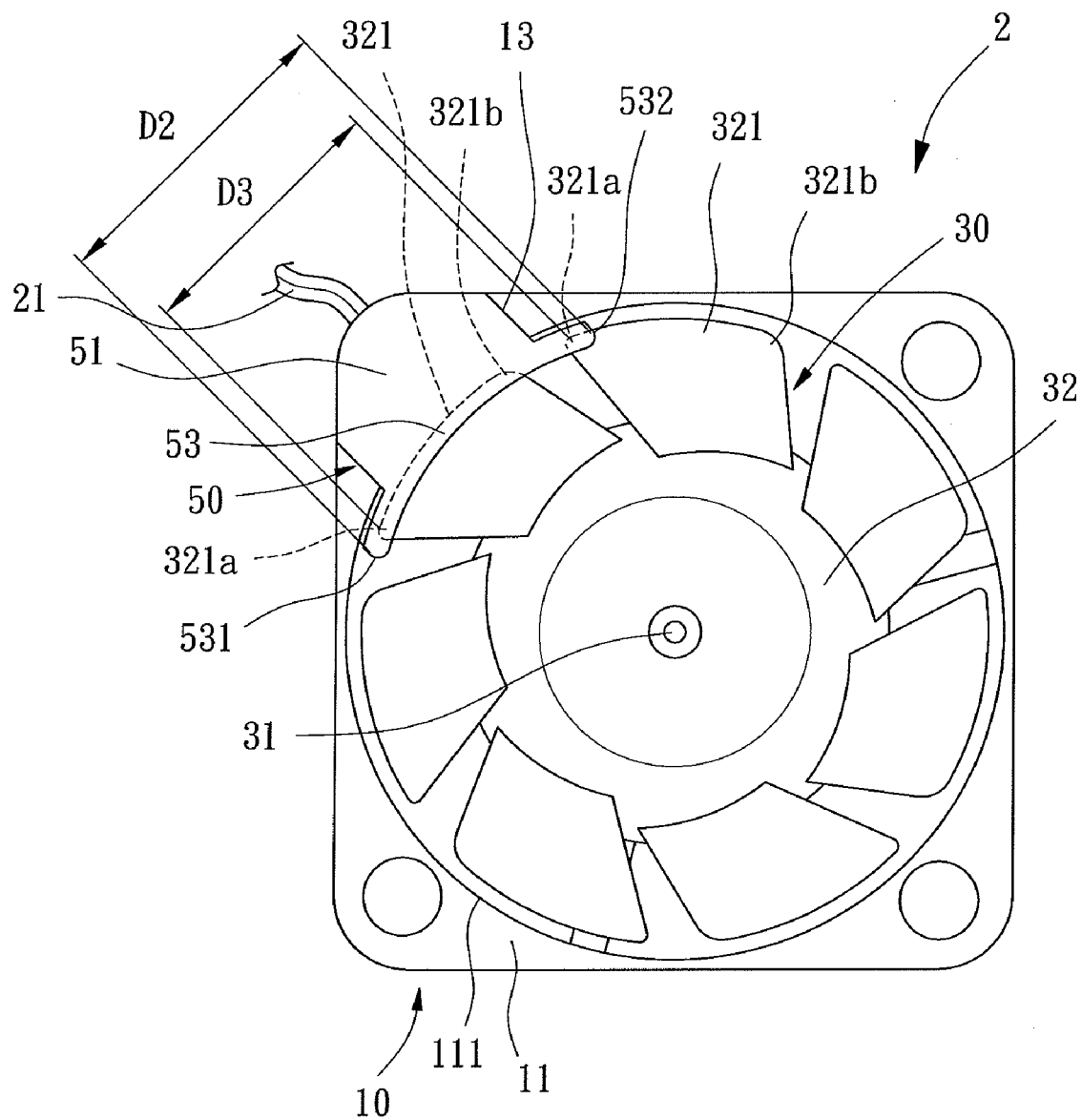
FIG. 6 is a top view illustrating the heat-dissipating fan of FIG. 5.

FIGS. 5 and 6 show a heat-dissipating fan 2 of a second embodiment according to the preferred teachings of the present invention. In the preferred form shown, the heat-dissipating fan 2 includes a housing 10, a stator 20, a rotor 30 and a retaining member 50. The housing 10, the stator 20 and the rotor 30 are similar to those of the first embodiment, wherein descriptions of the similarities are omitted. Besides, there is a third peripheral spacing "D3" defined as a projection of a second distance on the plane perpendicular to the shaft 31, with the second distance being between two first corners 321a of any two adjacent blades 321.

The retaining member 50 of the second embodiment includes a body 51, a combining block 52 and a retaining plate 53. Plural positioning protrusions 511 and the combining block 52 are formed on a bottom of the body 51 for being inserted into the through holes 131 of the housing 10 and received in the recess, namely the assembling section 13, respectively. The retaining plate 53 is formed on a side of the body 51 and has a first edge corner 531 and a second edge corner 532, as shown in FIG. 6. There is also a second peripheral spacing "D2" between the first and second edge corners 531 and 532 and larger than the third peripheral spacing "D3".

Figure 7:
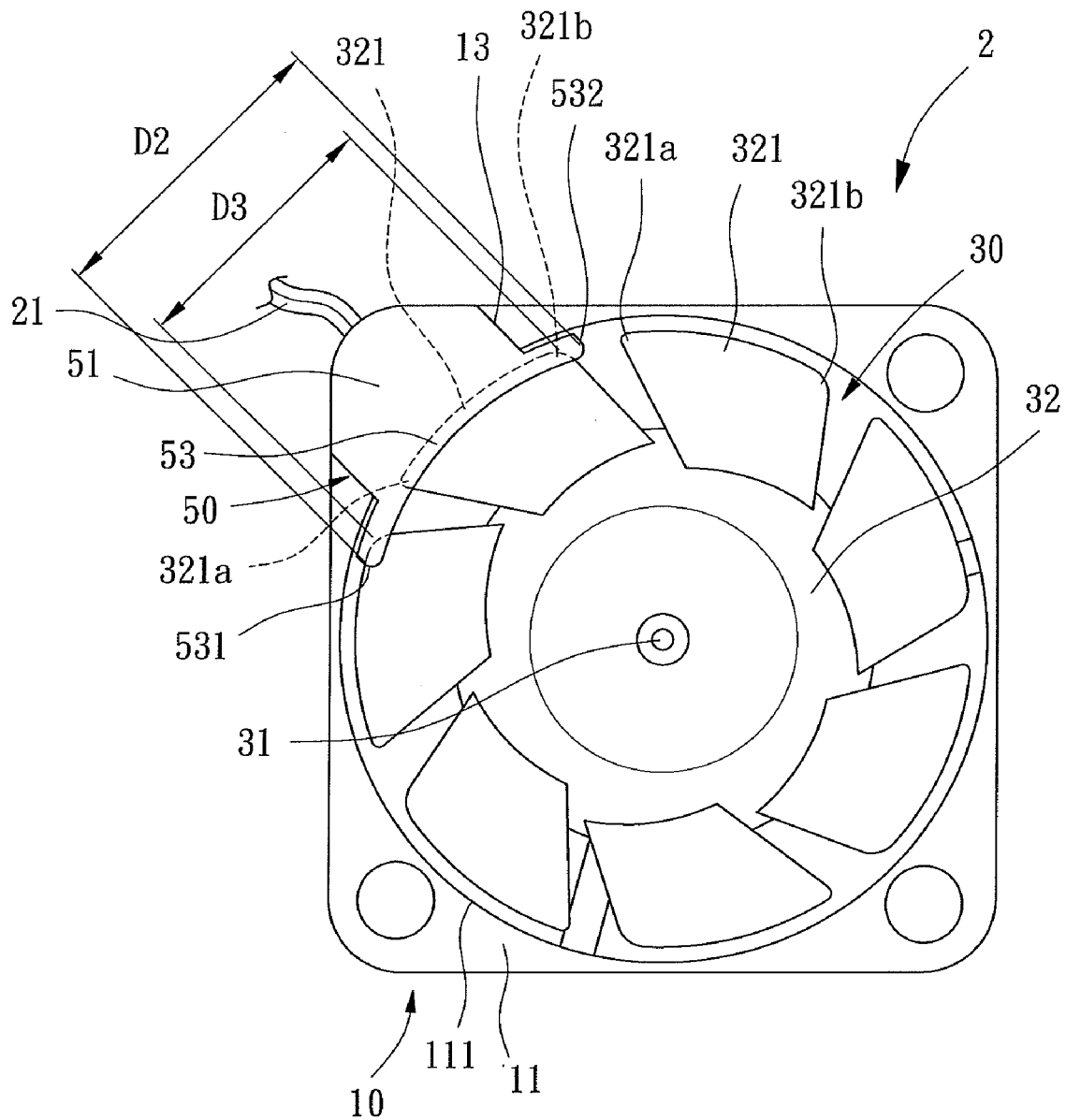
FIG. 7 is another top view illustrating the heat-dissipating fan of FIG. 5.

It is noted that the major difference between the retaining member 50 of the second embodiment and the retaining member 40 of the first embodiment is shown as the following. By the design of the second peripheral spacing "D2" larger than the third peripheral spacing "D3", a retainable area of the retaining member 50 defined between the first and second edge corners 531, 532 can axially cover two adjacent blades 321 and at least a first corner 321a of the two adjacent blades 321. By this arrangement, referring to FIGS. 6 and 7 illustrating rotation of the rotor 30, the first corner 321a of a blade 321 will not leave the retainable area before the first corner 321a of the next blade 321 enters the retainable area, or the first corners 321a of two adjacent blades 321 are both covered by the retaining plate 53 at the same time, so that the first corner 321a of each blade 321 is effectively prevented from being over the top of the retaining member 50 in its rotational movement. Thus, departure of the rotor 30 from the housing 10 is avoided.

Figure 8:
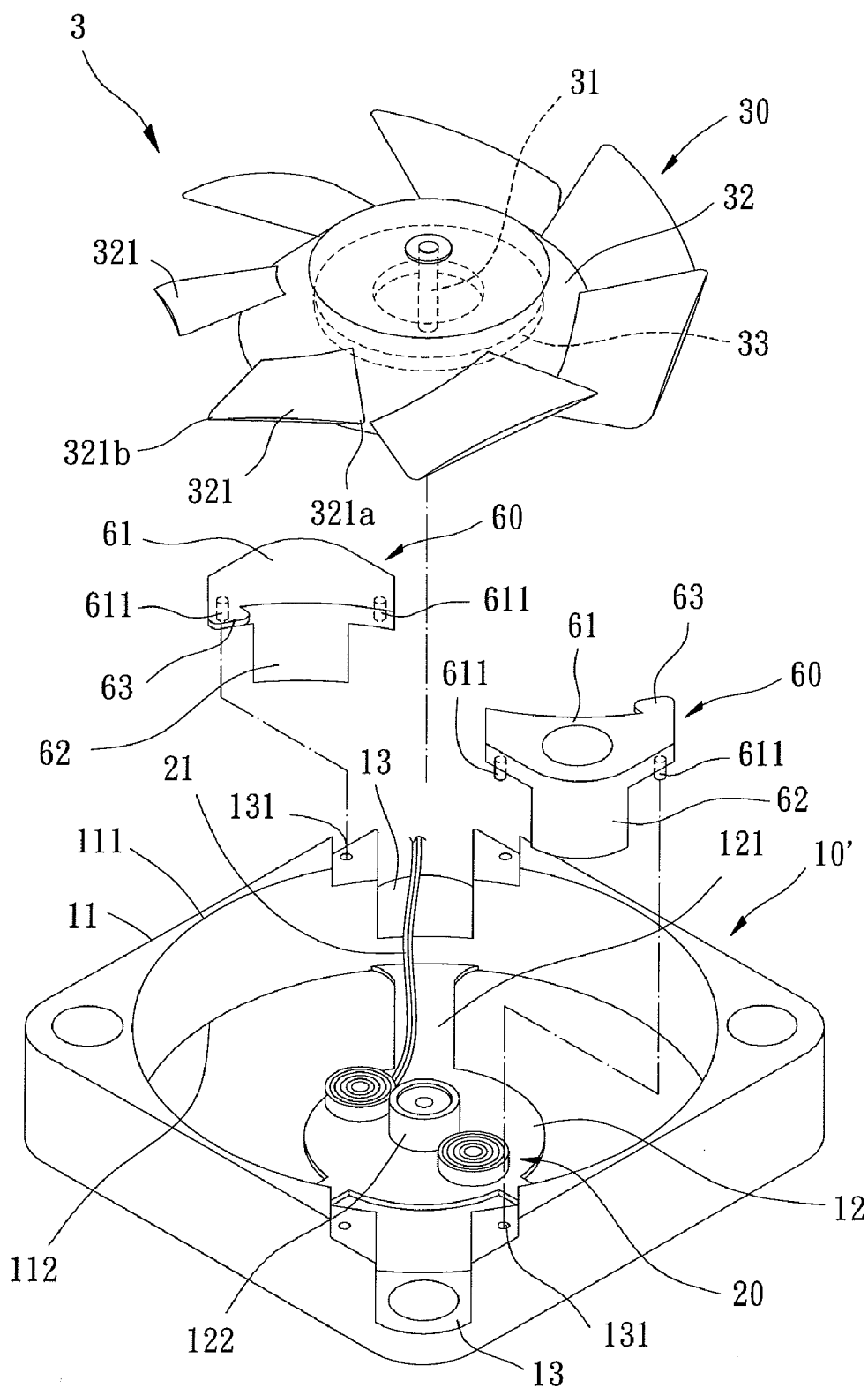
FIG. 8 is an exploded perspective view illustrating a heat-dissipating fan in accordance with a third embodiment of the present invention.
Figure 9:
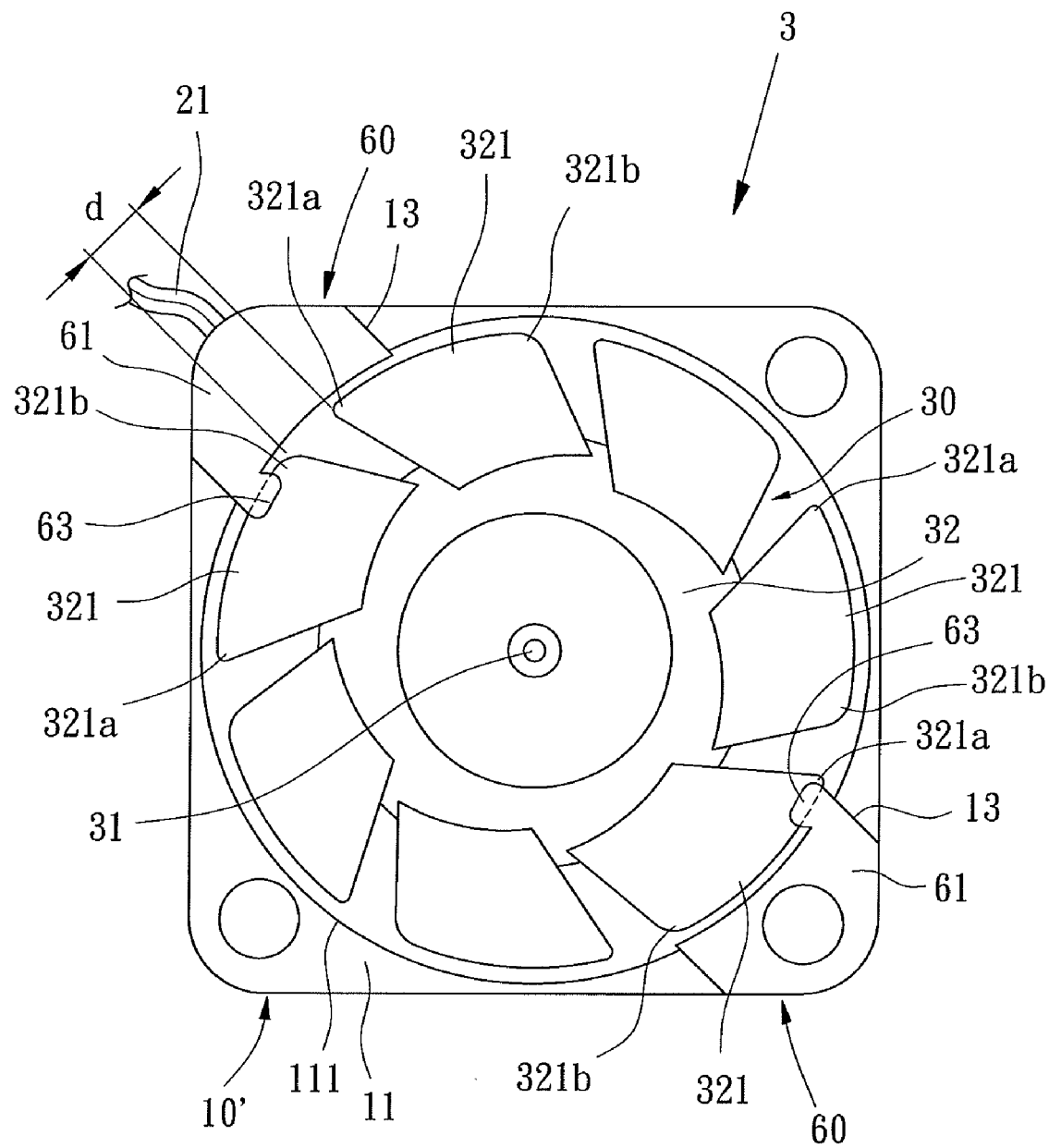
FIG. 9 is a top view illustrating the heat-dissipating fan of FIG. 8.

A heat-dissipating fan designated 3 of a third embodiment according to the preferred teachings of the present invention is shown in FIGS. 8 and 9 of the drawings. According to the third embodiment shown, the heat-dissipating fan 3 includes a housing 10', a stator 20, a rotor 30 and a plurality of retaining members 60. The stator 20 and the rotor 30 are similar to those of the first embodiment, and thus descriptions of the similarities are omitted. The major difference between the housing 10' of the third embodiment and the housing 10 of the first embodiment is that two portions of the frame body 11 delimiting the air inlet 111 form two assembling sections 13. It is noted that a number of the assembling sections 13 can be designed more than two according to needs of use.

Although there are two retaining members 60 in this embodiment, a number of the retaining members 60 can be designed more than two if necessary. Each retaining member 60 includes a body 61 having plural positioning protrusions 611 formed on the bottom of the body, a combining block 62 formed on the bottom of the body 61, and a retaining plate 63 formed on a side of the body 61.

Figure 10:
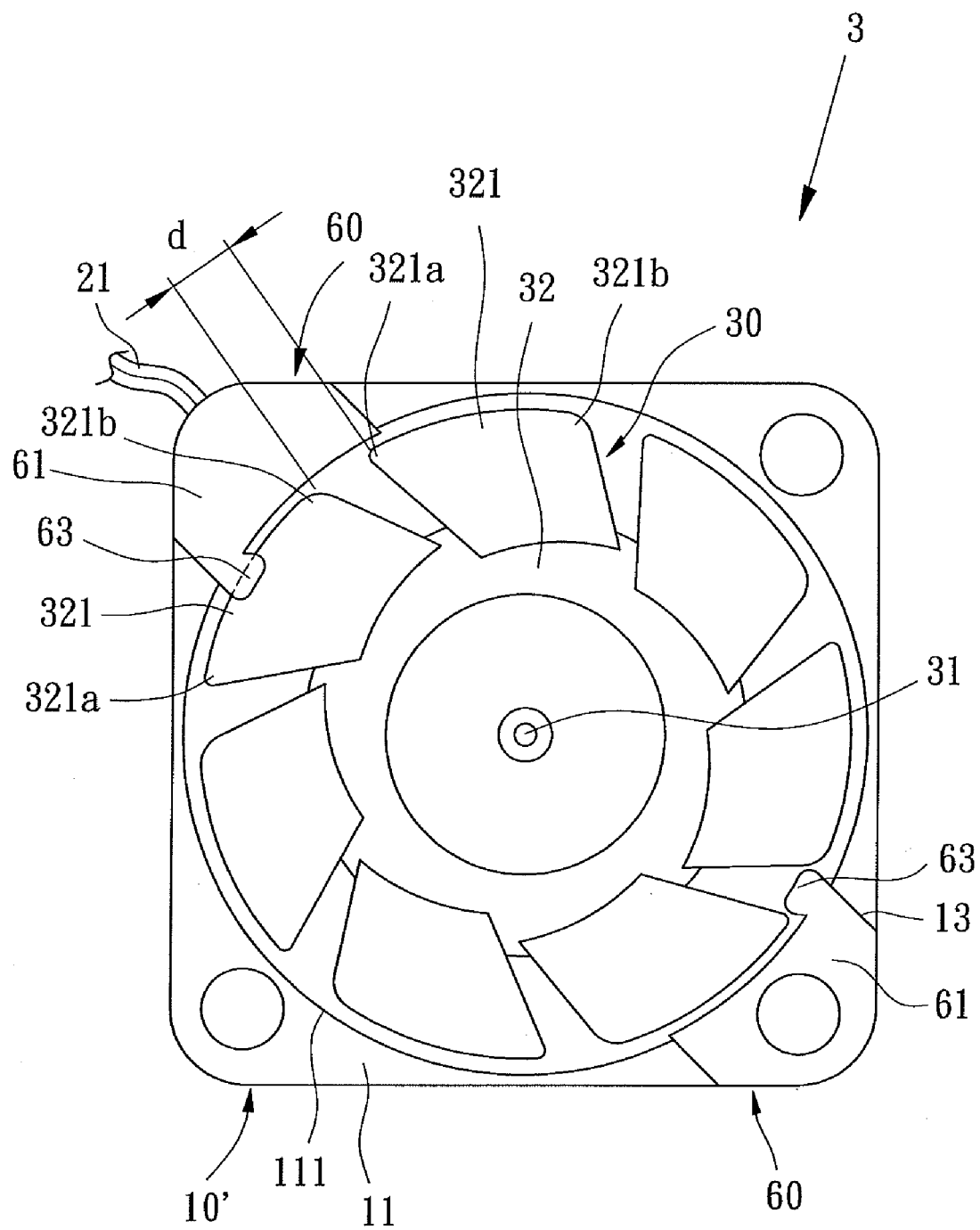
FIG. 10 is a top view illustrating operation of the heat-dissipating fan of FIG. 9.

The major difference between the retaining members 60 and the retaining member 40, 50 of the first and second embodiments is that the number of the retaining members 60 is plural. As shown in FIG. 10, in rotation of the rotor 30, at least one retaining member 60 can axially cover a part of one of the blades 321 of the rotor 30 with its retaining plate 63 to retain the rotor 30, while the retaining plate 63 of the other retaining member 60 axially covers the gap "d" or a part of another blade 321. Therefore, the rotor 30 can be prevented from departing from the housing 10 by the plural retaining members 60, and the necessity of changing dimensions of the retaining plates 63 when the rotor 30 is replaced by any other rotor with different designs of blades, which exists in the first and second embodiments, doesn't exist in the third embodiment, so that convenience of manufacturing the retaining member 60 is enhanced.

Figure 11:
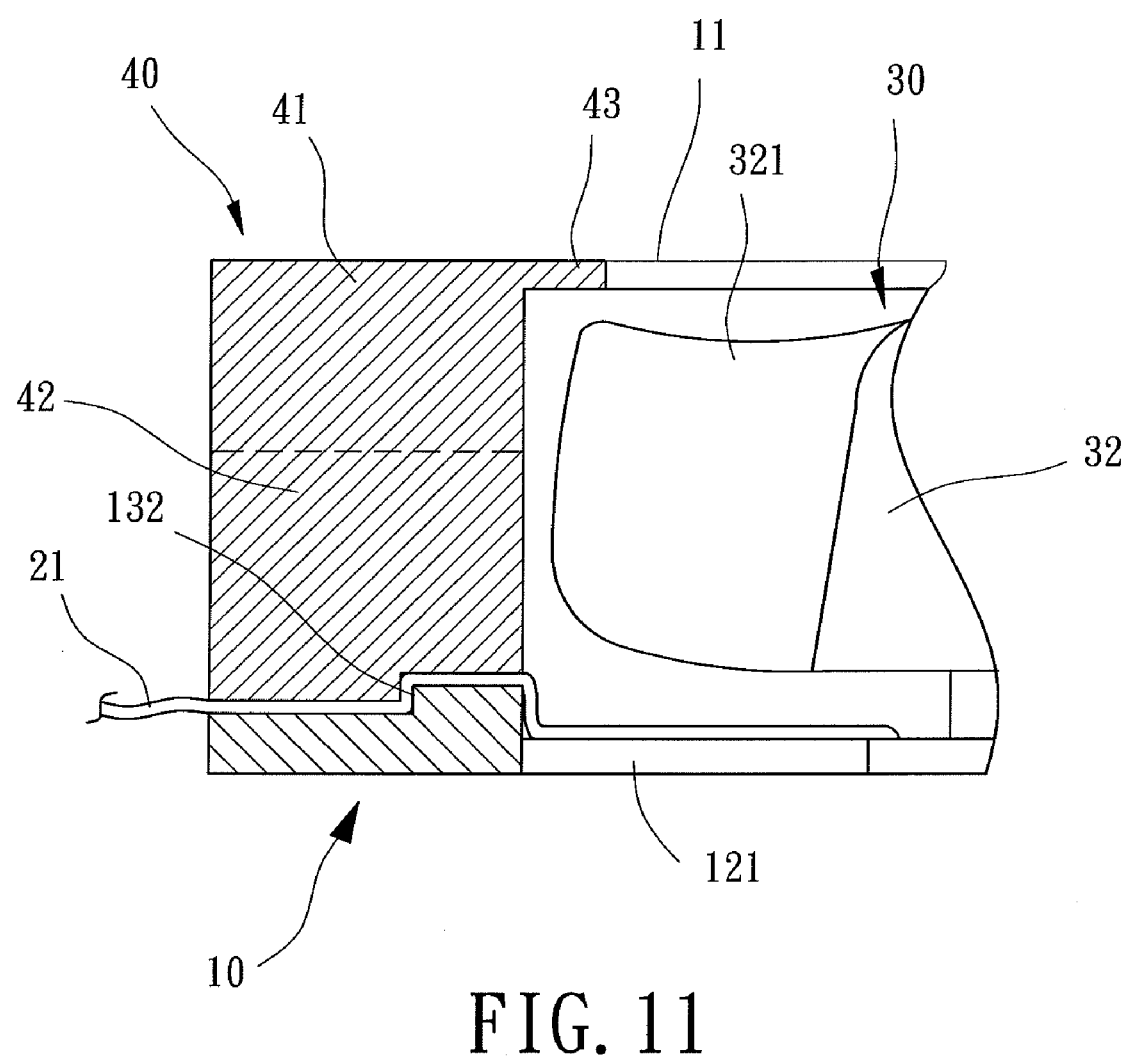
FIG. 11 is a partial and cross sectional view illustrating a step formed on a bottom of an assembling section of a housing of the heat-dissipating fan of FIG. 3.

FIG. 11 shows a partial and cross sectional view of the heat-dissipating fan illustrating that a part of a bottom of the recess-shaped assembling section 13 forms a step 132. It is noted that the step 132 of the assembling section 13 can be formed in each of the first, second and third embodiments, although FIG. 11 only illustrates the step 132 in the first embodiment. Additionally, a surface of the combining block 42, which faces the bottom of the assembling section 13, is complementary to the bottom of the assembling section 13. Namely, the surface is in a shape fitting the shape of the bottom of the assembling section 13 having the step 132. With the retaining member 40 engaging with the assembling section 13 of the housing 10, the power line 21 sandwiched between the combining block 42 and the bottom of the assembling section 13 is bent to be further positioned. Hence, movement of the power line 21 is avoided while it is pulled.

As has been discussed above, by the retaining member 40, 50, 60, the rotor 30 is prevented from disengaging from the housing 10, 10' during movement, encasement or operation of the heat-dissipating fan 1, 2, 3, even if the heat-dissipating fan 1, 2, 3 is hit strongly. Furthermore, the retaining member 40, 50, 60 is not a flange in the form of a ring formed on the periphery of the air inlet 111 and does not reduce a diameter of the air inlet 111. Thus, reduction of air input is avoided, and reliable heat-dissipating efficiency is provided. Besides, with the retaining member 40, 50, 60 being removably coupled with the housing 10, 10', the housing 10, 10' can be integrally formed, and the assembly of the heat-dissipating fan 1, 2, 3 can be quickly finished by directly mounting the retaining member 40, 50, 60 to the assembling section 13 after the stator 20 and the rotor 30 are mounted inside the housing 10, 10'. Consequently, an assembly of the heat-dissipating fan of the present invention is not limited. Namely, changeable sequence of the steps in assembling the heat-dissipating fan is allowed to provide convenience of assembling.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A heat-dissipating fan comprising:
a housing including an air inlet and an air outlet;
a stator received inside the housing;
a rotor including a shaft and an impeller fixed to one end of the shaft, with the impeller facing the stator and having a plurality of blades, with one radially outer free end of each blade having a first corner close to the air inlet and a second corner close to the air outlet, with a first peripheral spacing defined as a projection of a first distance on a plane perpendicular to the shaft and the first distance being between adjacent first and second corners which are respectively on any two adjacent blades; and
a retaining member including a retaining plate and removably mounted to the housing at a portion delimiting the air inlet, with the retaining plate extending to be above the air inlet and within a rotational area of the plurality of blades in an axial direction of the shaft, with one end of the retaining plate which extends to be above the air inlet having a first edge corner and a second edge corner, with a second peripheral spacing between the first and second edge corners being larger than the first peripheral spacing.

2. The heat-dissipating fan as defined in claim 1, wherein the portion delimiting the air inlet forms an assembling section and the retaining member is removably mounted to the assembling section.

3. The heat-dissipating fan as defined in claim 2, wherein the assembling section is a recess and the retaining member further includes a body and a combining block formed on a bottom of the body, with the combining block being received in the recess, with the retaining plate being formed on a side of the body.

4. The heat-dissipating fan as defined in claim 3, wherein plural through holes are formed in the assembling section and plural positioning protrusions are formed on the bottom of the body, with the plural positioning protrusions being inserted into the plural through holes.

5. The heat-dissipating fan as defined in claim 3, wherein a power line is electrically connected to the stator and one end of the power line extends out of the housing through the assembling section, with the power line being sandwiched between the retaining member and the assembling section.

6. The heat-dissipating fan as defined in claim 5, wherein a part of a bottom of the assembling section forms a step and a surface of the combining block, which faces the bottom of the assembling section, is in a shape fitting the bottom of the assembling section having the step.

7. The heat-dissipating fan as defined in claim 1, wherein a third peripheral spacing is defined as a projection of a second distance on the plane perpendicular to the shaft, with the second distance being between two first corners of any two adjacent blades, with the second peripheral spacing between the first and second edge corners of the retaining member being larger than the third peripheral spacing.

8. The heat-dissipating fan as defined in claim 1 further comprising a balancing plate made of magnetically conductive material and mounted inside the housing, with a permanent magnet being mounted to an inner periphery of the impeller to magnetically attract the balancing plate.

9. A heat-dissipating fan comprising:
a housing including an air inlet and an air outlet;
a stator received inside the housing;
a rotor including a shaft and an impeller fixed to one end of the shaft, with the impeller facing the stator and having a plurality of blades; and
a plurality of retaining members being removably mounted to the housing at a portion delimiting the air inlet, with each retaining member including a retaining plate extending to be above the air inlet and within a rotational area of the plurality of blades in an axial direction of the shaft;
wherein at least one retaining member axially covers a part of one of the plurality of blades of the rotor with the retaining plate.

10. The heat-dissipating fan as defined in claim 9, wherein the portion delimiting the air inlet forms a plurality of assembling sections and the plurality of retaining members is removably mounted to the plurality of assembling sections respectively.

11. The heat-dissipating fan as defined in claim 10, wherein each of the plurality of assembling sections is a recess and each of the plurality of retaining members further includes a body and a combining block formed on a bottom of the body, with the combining block being received in the recess, with the retaining plate being formed on a side of the body.

12. The heat-dissipating fan as defined in claim 11, wherein plural through holes are formed in each assembling section and plural positioning protrusions are formed on the bottom of each body, with the plural positioning protrusions being inserted into the plural through holes.

13. The heat-dissipating fan as defined in claim 11, wherein a power line is electrically connected to the stator and one end of the power line extends out of the housing through one of the plurality of assembling sections, with the power line being sandwiched between the said one of the plurality of assembling sections and the retaining member mounted to the one of the plurality of assembling sections.

14. The heat-dissipating fan as defined in claim 13, wherein a part of a bottom of one of the plurality of assembling sections forms a step, and wherein a surface of the combining block of the retaining member is complementary to the bottom of the said one of the plurality of assembling sections, with the surface of the combining block facing the bottom of the said one of the plurality of assembling sections and the power line passing through the step.

\* \* \* \* \*